United States Patent
Birner et al.

(10) Patent No.: US 10,050,139 B2
(45) Date of Patent: Aug. 14, 2018

(54) SEMICONDUCTOR DEVICE INCLUDING A LDMOS TRANSISTOR AND METHOD

(71) Applicant: Infineon Technologies AG, Neubiberg (DE)

(72) Inventors: Albert Birner, Regensburg (DE);
Helmut Brech, Lappersdorf (DE);
Matthias Zigldrum, Regensburg (DE);
Michaela Braun, Regensburg (DE);
Jan Ropohl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/191,937

(22) Filed: Jun. 24, 2016

(65) Prior Publication Data
US 2017/0373187 A1    Dec. 28, 2017

(51) Int. Cl.
| | |
|---|---|
| *H01L 29/78* | (2006.01) |
| *H01L 29/66* | (2006.01) |
| *H01L 29/10* | (2006.01) |
| *H01L 23/522* | (2006.01) |
| *H01L 23/532* | (2006.01) |
| *H01L 23/528* | (2006.01) |
| *H01L 21/768* | (2006.01) |

(52) U.S. Cl.
CPC .... *H01L 29/7816* (2013.01); *H01L 21/76804* (2013.01); *H01L 21/76877* (2013.01); *H01L 23/5226* (2013.01); *H01L 23/5283* (2013.01); *H01L 23/53228* (2013.01); *H01L 29/1095* (2013.01); *H01L 29/66681* (2013.01)

(58) Field of Classification Search
None
See application file for complete search history.

(56) References Cited

U.S. PATENT DOCUMENTS

| | | | |
|---|---|---|---|
| 5,252,848 | A  | 10/1993 | Adler et al. |
| 6,048,772 | A  | 4/2000  | D'Anna |
| 7,119,399 | B2 | 10/2006 | Ma et al. |
| 7,221,034 | B2 | 5/2007  | Ma et al. |
| 7,253,492 | B2 | 8/2007  | Ma et al. |
| 7,456,094 | B2 | 11/2008 | Ma et al. |
| 7,626,233 | B2 | 12/2009 | Tornblad et al. |
| 7,772,123 | B2 | 8/2010  | Birner et al. |
| 8,227,340 | B2 | 7/2012  | Seidel et al. |
| 8,399,936 | B2 | 3/2013  | Birner et al. |
| 8,518,764 | B2 | 8/2013  | Dao et al. |
| 8,680,615 | B2 | 3/2014  | Mitra et al. |
| 8,716,791 | B1 | 5/2014  | Iravani et al. |

(Continued)

FOREIGN PATENT DOCUMENTS

DE    10348641 A1    5/2005

OTHER PUBLICATIONS

Sunitha, et al., "Reduced Surface Field Technology for LDMOS: A Review", International Journal of Emerging Technology and Advanced Engineering, vol. 4, Issue 6, Jun. 2014, pp. 173-176.

*Primary Examiner* — Jay C Chang

(74) *Attorney, Agent, or Firm* — Murphy, Bilak & Homiller, PLLC

(57) ABSTRACT

In an embodiment, a semiconductor device includes a semiconductor substrate having a front surface, a LDMOS transistor in the front surface, and a metallization structure arranged on the front surface. The metallization structure includes at least one cavity arranged in at least one dielectric layer.

14 Claims, 15 Drawing Sheets

(56) References Cited

U.S. PATENT DOCUMENTS

| | | |
|---|---|---|
| 8,890,324 B2 | 11/2014 | Dao |
| 9,064,712 B2 | 6/2015 | Sanders et al. |
| 9,165,918 B1 | 10/2015 | Yang et al. |
| 9,245,952 B2 | 1/2016 | Yao et al. |
| 2002/0038891 A1 | 4/2002 | Ryu et al. |
| 2004/0229456 A1 | 11/2004 | Andricacos et al. |
| 2006/0046350 A1 | 3/2006 | Jiang et al. |
| 2006/0183317 A1* | 8/2006 | Noguchi ........... H01L 21/76801 438/629 |
| 2006/0289924 A1 | 12/2006 | Wang |
| 2008/0093641 A1 | 4/2008 | Ludikhuize et al. |
| 2008/0119007 A1 | 5/2008 | Raghuram et al. |
| 2008/0166849 A1 | 7/2008 | Yang et al. |
| 2009/0026539 A1 | 1/2009 | Birner et al. |
| 2009/0294849 A1 | 12/2009 | Min et al. |
| 2009/0302480 A1* | 12/2009 | Birner ............... H01L 21/76898 257/774 |
| 2010/0022084 A1 | 1/2010 | Chen et al. |
| 2010/0032756 A1 | 2/2010 | Pendharkar et al. |
| 2010/0230818 A1 | 9/2010 | Birner et al. |
| 2010/0295154 A1 | 11/2010 | Riess |
| 2011/0074040 A1 | 3/2011 | Frank et al. |
| 2011/0101425 A1 | 5/2011 | Grote et al. |
| 2011/0309442 A1 | 12/2011 | Grote et al. |
| 2012/0037969 A1* | 2/2012 | Sanders ................ H01L 23/481 257/296 |
| 2012/0061758 A1 | 3/2012 | Khan et al. |
| 2012/0061798 A1 | 3/2012 | Wong et al. |
| 2013/0119547 A1 | 5/2013 | Kim et al. |
| 2014/0225186 A1* | 8/2014 | Abou-Khalil ......... H01L 29/407 257/330 |
| 2014/0264896 A1* | 9/2014 | Lu ...................... H01L 23/5329 257/773 |
| 2015/0243583 A1 | 8/2015 | Li et al. |
| 2015/0251382 A1 | 9/2015 | Terasaki et al. |
| 2015/0294898 A1* | 10/2015 | Yamaguchi ....... H01L 21/76224 257/506 |
| 2016/0141362 A1* | 5/2016 | Gogoi ................ H01L 29/0657 257/329 |

\* cited by examiner

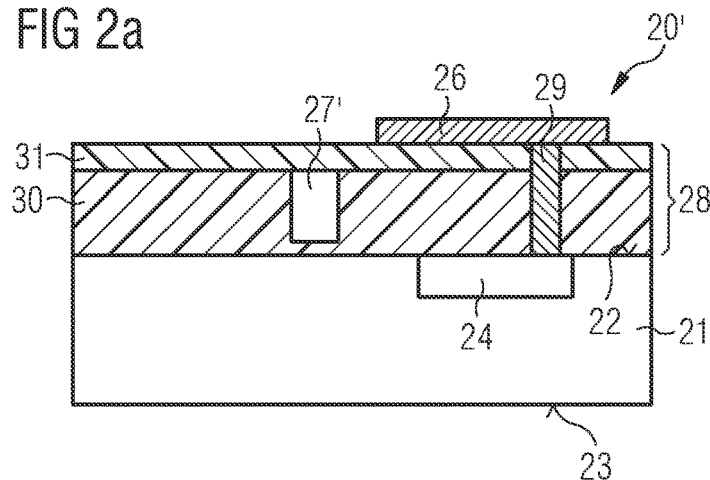
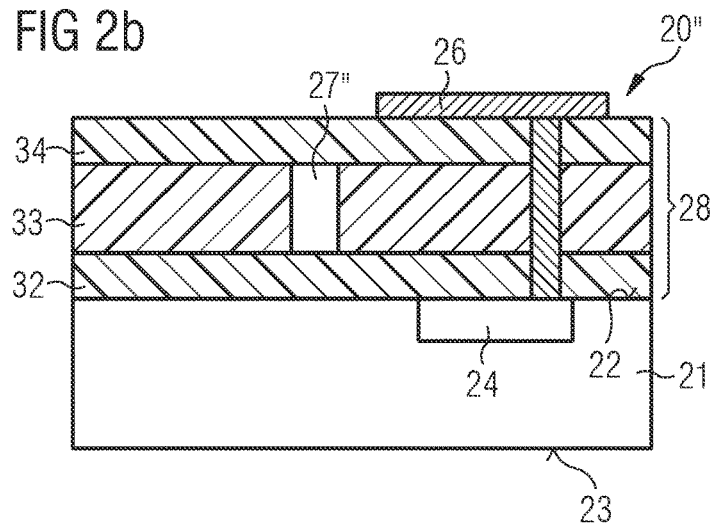
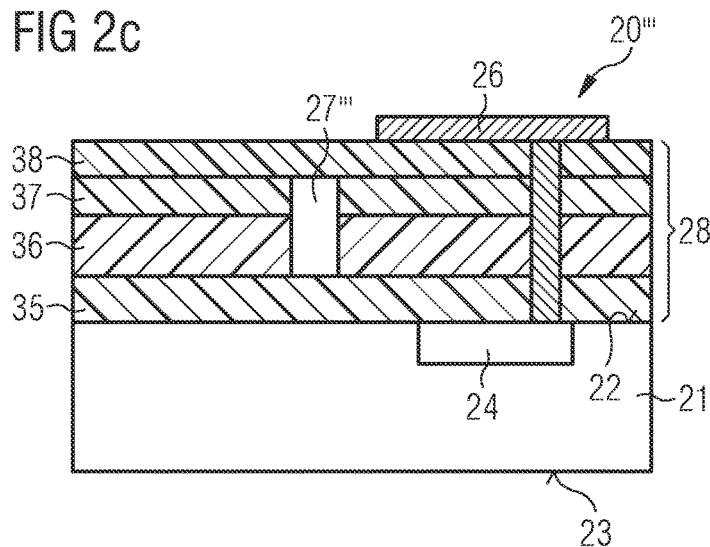

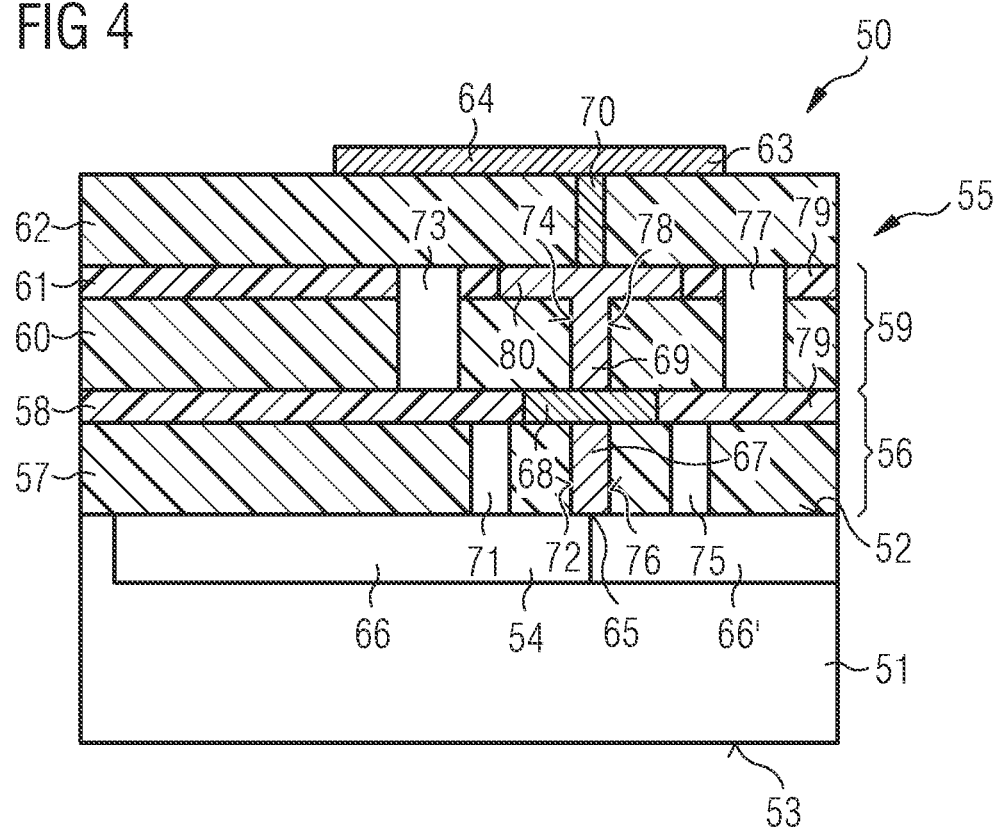

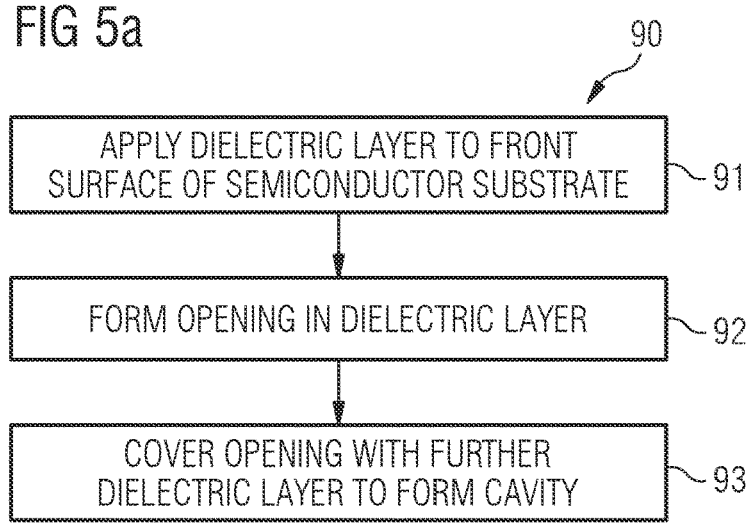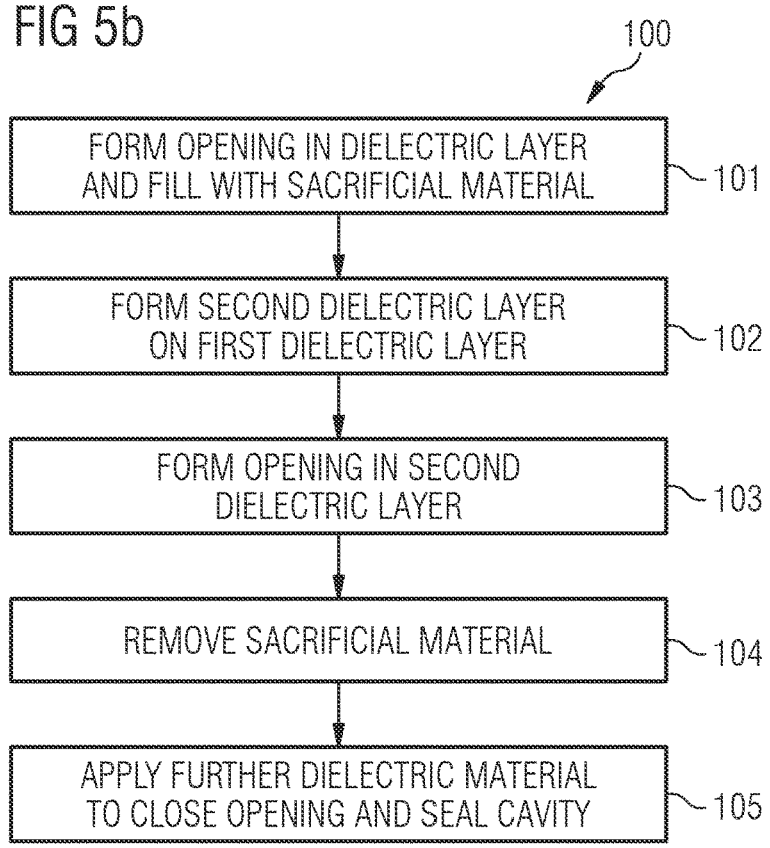

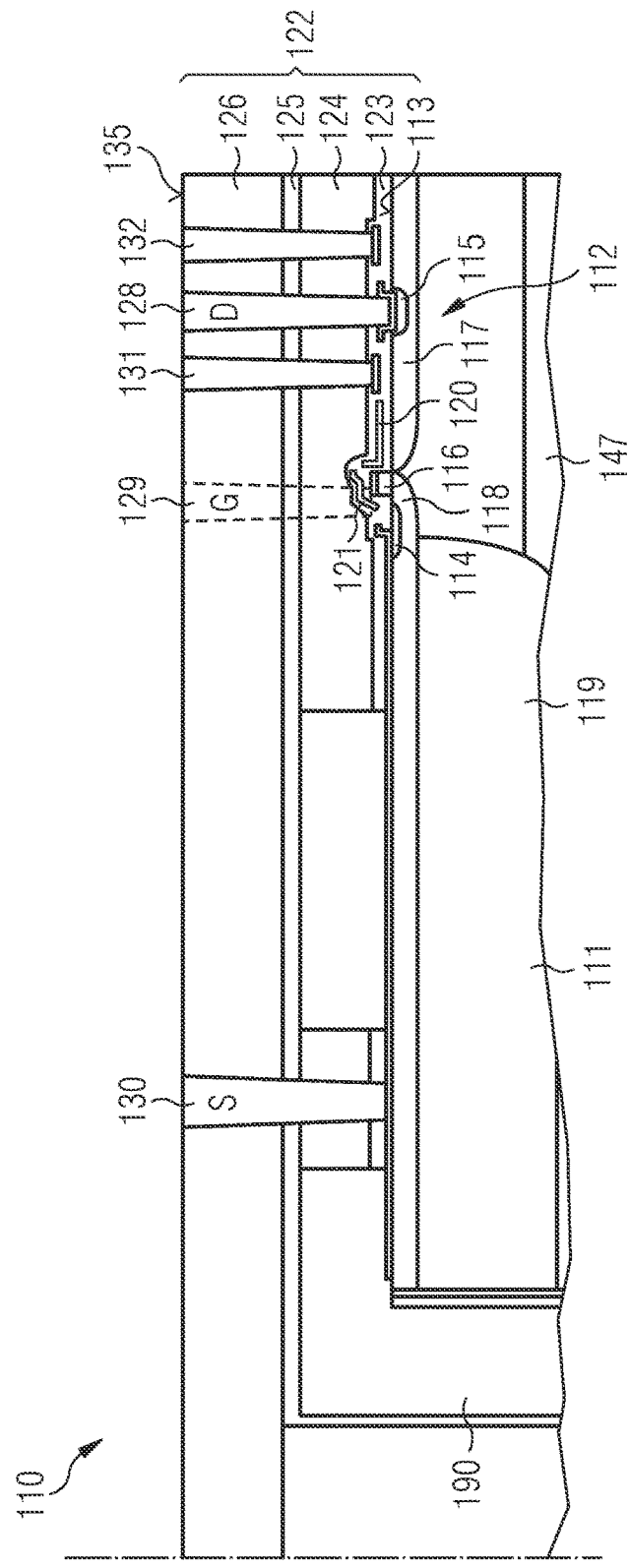

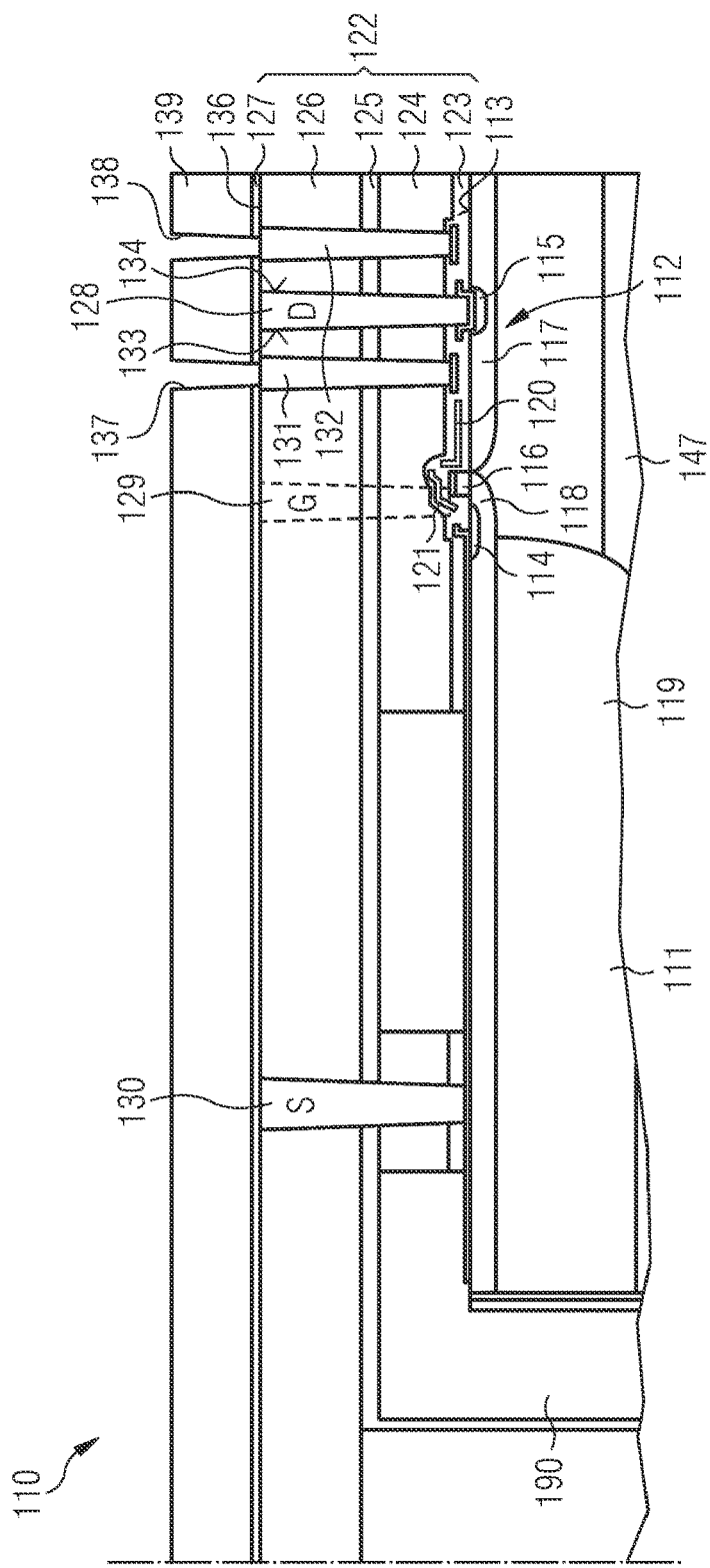

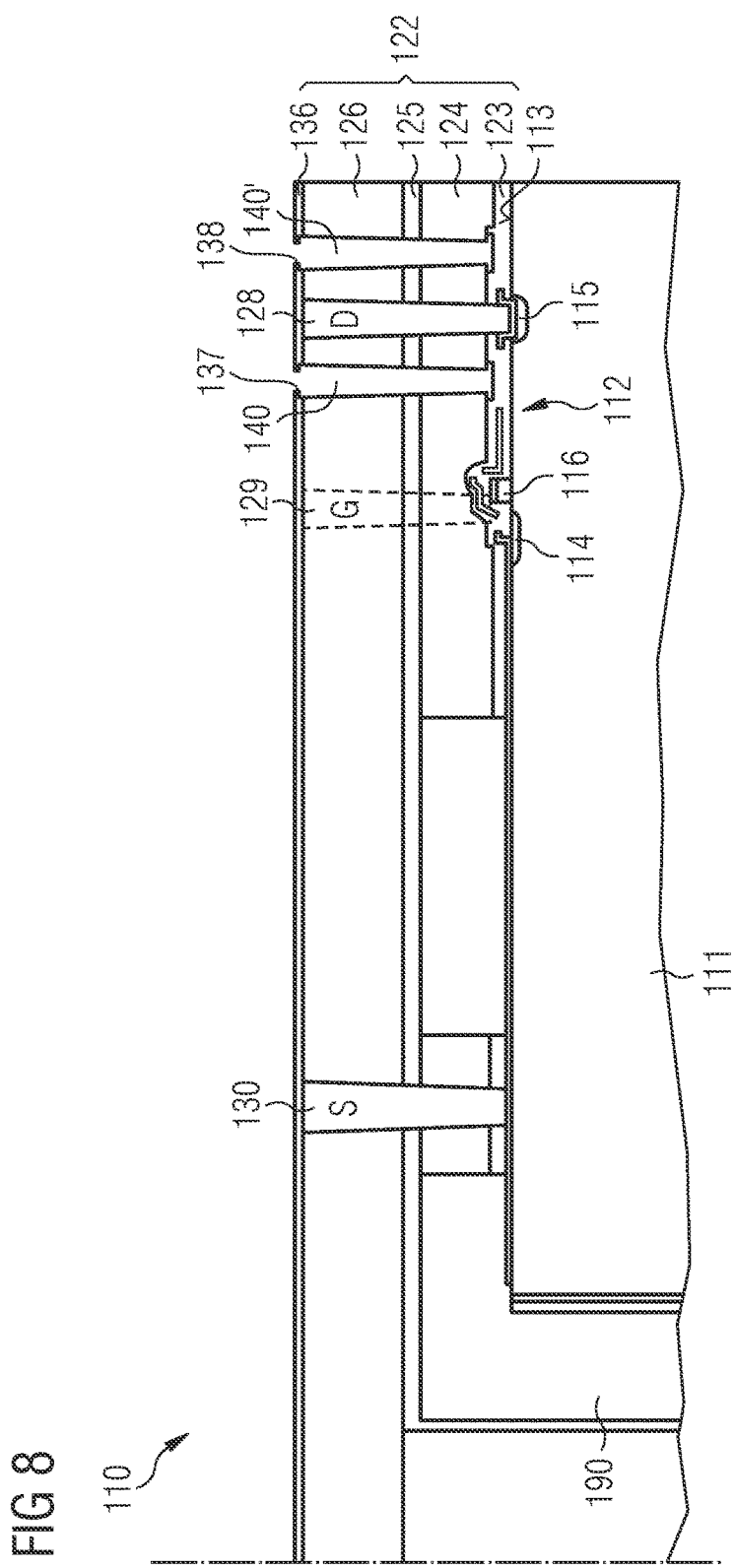

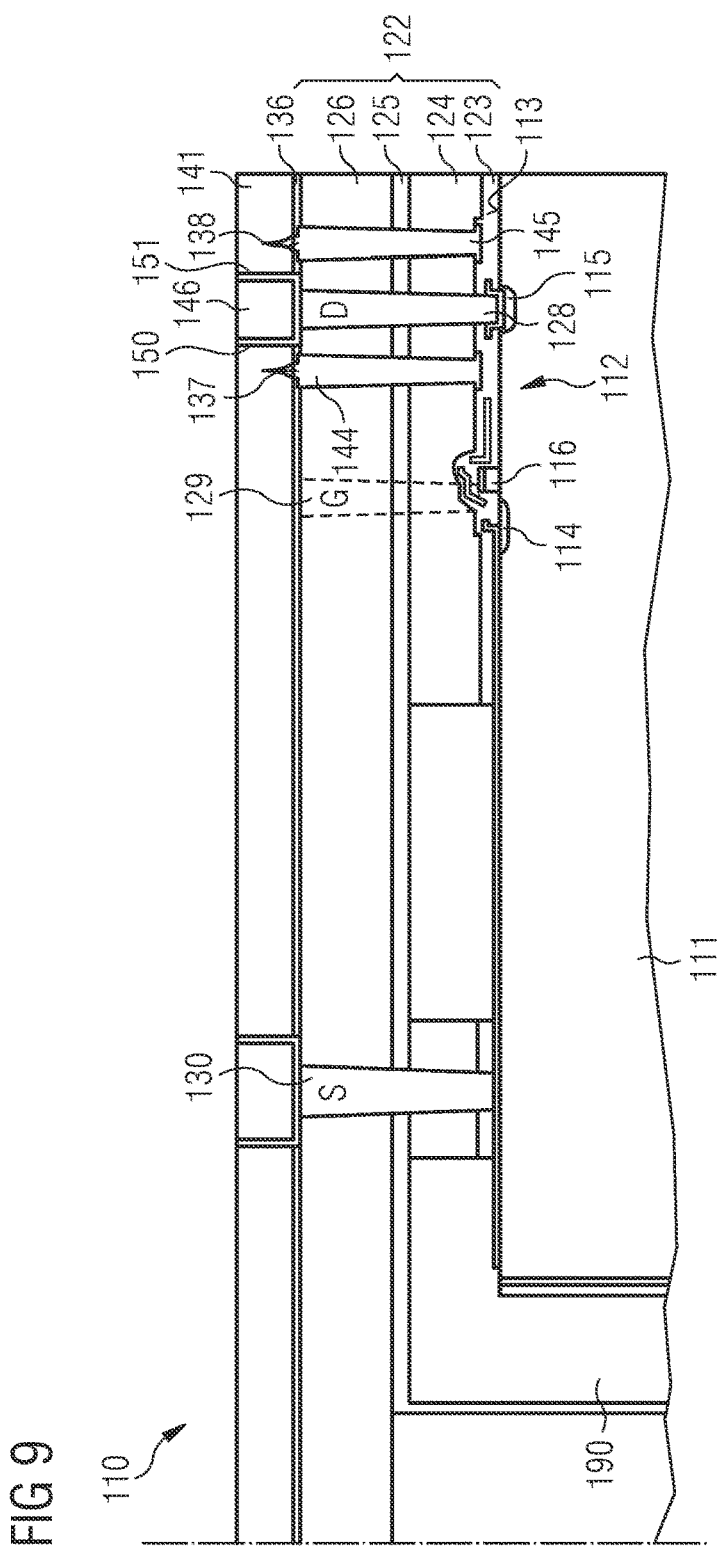

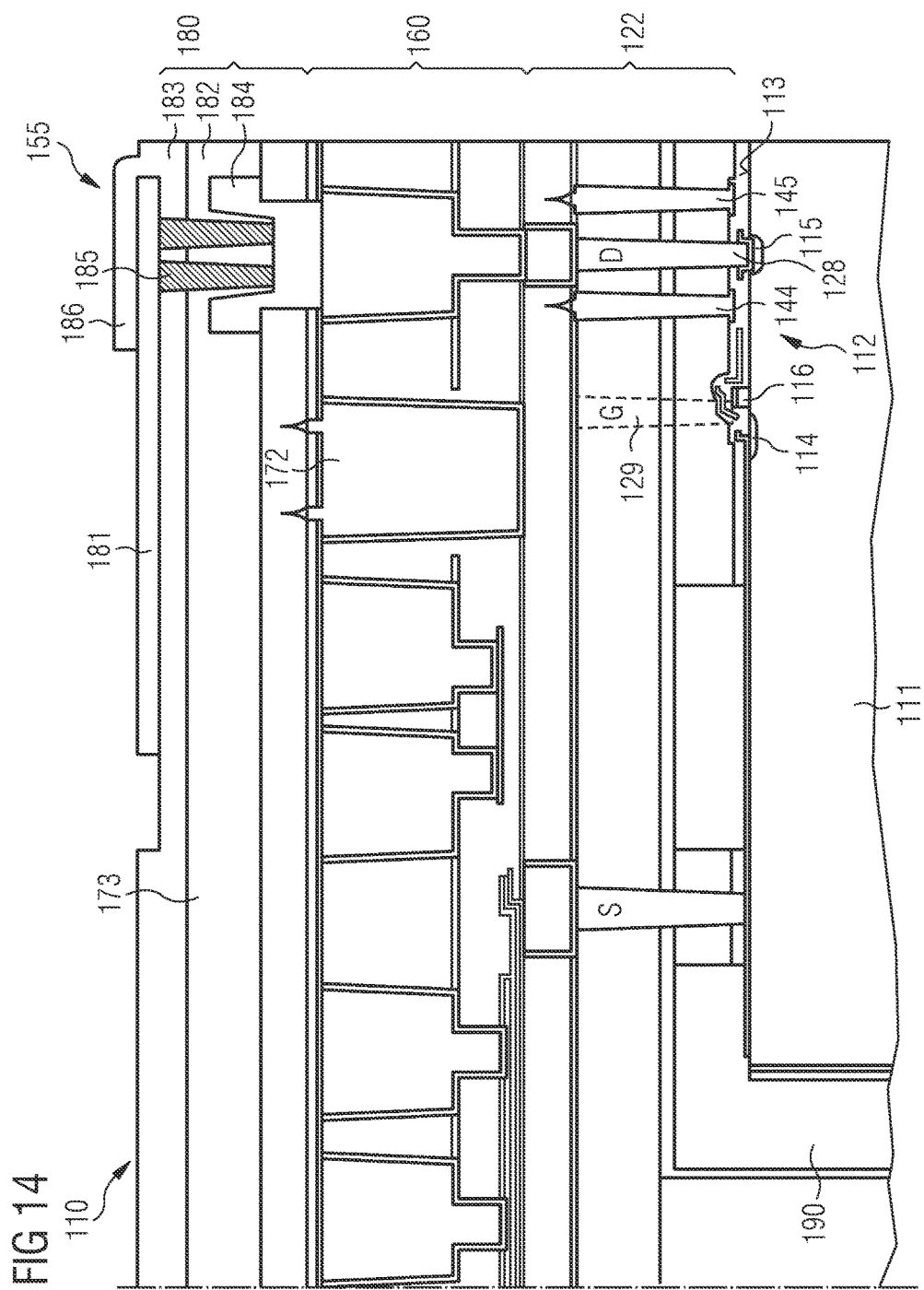

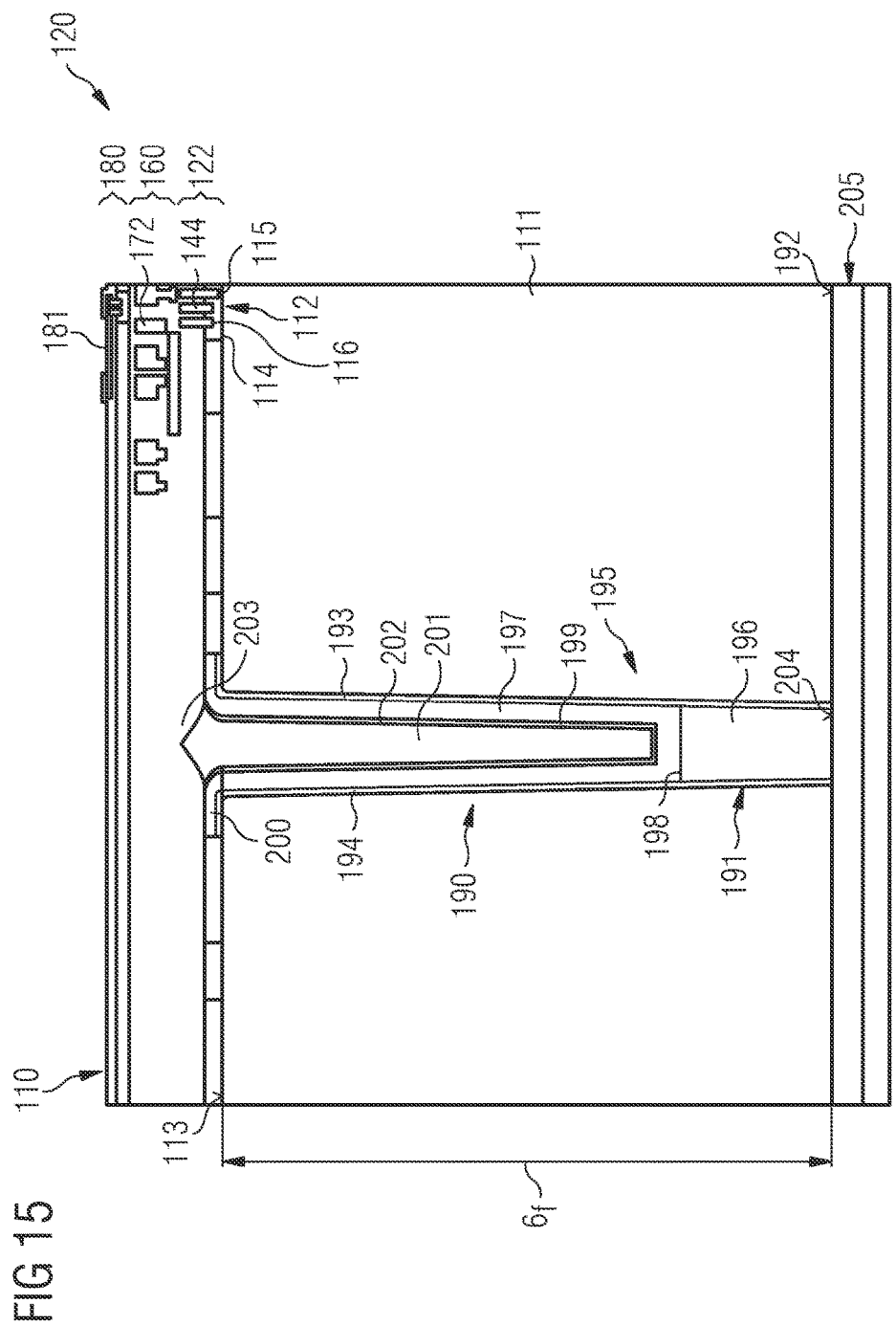

SEMICONDUCTOR DEVICE INCLUDING A LDMOS TRANSISTOR AND METHOD

BACKGROUND

There is an ongoing need for solid state circuits adapted to operate at higher and higher frequencies, including microwave frequencies. As used herein, the term "microwave" is intended to refer to frequencies at or above about 200 mega-Hertz, for example in the range of 300 Mhz to 3 GHz. Various transistor structures have been created that are capable of providing gain in such frequency ranges. A LDMOS (Lateral Diffused Metal Oxide Semiconductor) transistor is an example of such a transistor structure.

At high frequencies parasitic coupling between conductive portions of the metallization structure of transistor structures can limit performance. One way of decreasing parasitic coupling is through the use of dielectric material with a lower dielectric constant within one or more layers of the metallization structure. Such dielectric materials may be called low-k dielectrics and typically have a dielectric constant k in the range of 2.5 to 4.1. However, such low-k dielectric materials may be mechanically sensitive and more difficult to process.

Therefore, further improvements to reduce parasitic coupling in semiconductor devices for use at higher frequencies are desirable.

SUMMARY

In an embodiment, a semiconductor device includes a semiconductor substrate having a front surface, a LDMOS transistor the front surface and a metallization structure arranged on the front surface. The metallization structure includes at least, one cavity arranged in at least one dielectric layer.

In an embodiment, a LDMOS transistor includes a semiconductor substrate including a front surface, a doped source region, a gate, a doped drain region, a doped channel region, a doped drain drift region and a doped body contact region arranged in the front surface, a metallization structure arranged on the front surface, the metallization structure including one or more dielectric layers, one or more conductive redistribution layers arranged between one or more dielectric layers and one or more conductive vias extending through one or more dielectric layers, and at least one cavity defined by dielectric material, the cavity having a dielectric constant which is lower than a dielectric constant of the dielectric material defining the cavity.

In an embodiment, a method includes applying a dielectric layer to a front surface of a semiconductor substrate including a LDMOS transistor structure, forming an opening in at least one dielectric layer and covering the opening with a further dielectric layer to seal the cavity.

In an embodiment, a method includes positioning one or more cavities having a dielectric constant that is less than a dielectric constant of dielectric material of a metallization structure arranged on a LDMOS transistor in positions so as to reduce one or more of the group consisting of the electric field in the metallization structure at those positions, capacitive coupling between drain and gate, capacitive coupling between source and gate, and capacitive coupling between source and drain.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 2a illustrates a cavity formed in a dielectric layer of a metallization structure.

FIG. 2b illustrates a cavity formed in a dielectric layer of a metallization structure.

FIG. 2c illustrates a cavity formed in a dielectric layer of a metallization structure.

FIG. 3b illustrates a plan view of the semiconductor device of FIG. 3a.

FIG. 4 illustrates a semiconductor device including a LDMOS transistor and a multilevel metallization structure.

FIG. 5a illustrates a flow chart of a method for a cavity in a metallization structure of a LDMOS transistor.

FIG. 5b illustrates a flow chart of a method for a cavity in a metallization structure of a LDMOS transistor.

FIG. 6 illustrates a semiconductor device including a LDMOS transistor and a first level of a multilevel metallization structure.

FIG. 7 illustrates a semiconductor device including a LDMOS transistor and a first level of a multilevel metallization structure.

FIG. 8 illustrates a semiconductor device including a LDMOS transistor and a cavity within a first level of a multilevel metallization structure.

FIG. 9 illustrates a semiconductor device including a LDMOS transistor and a first level of a multilevel metallization structure with a drain runner.

FIG. 14 illustrates a semiconductor device including a LDMOS transistor and a multilevel metallization structure.

FIG. 15 illustrates a semiconductor device including a conductive through substrate via.

DETAILED DESCRIPTION

Figure 1A:
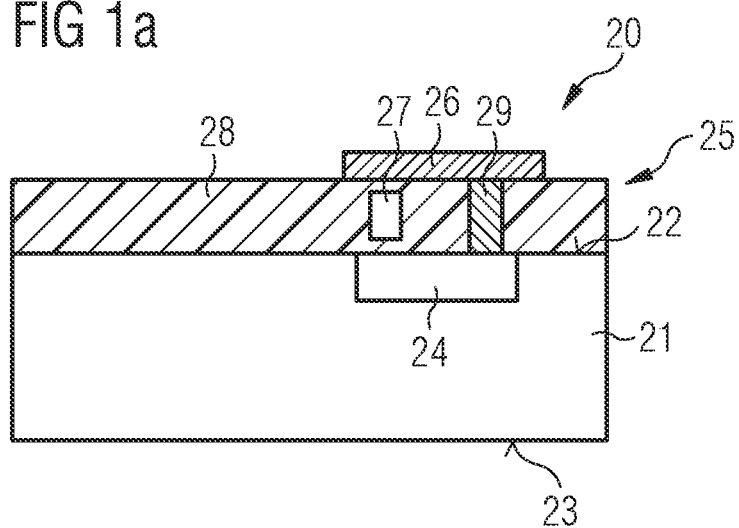
FIG. 1a illustrates a semiconductor device including a LDMOS transistor and a metallization structure.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

It will be understood by those of skill in the art that the active device(s), such as a LDMOS transistor, may be formed on or over the substrate or entirely within the substrate or partly within and partly on or over the substrate, depending upon the nature of the device(s). Accordingly, as used herein with respect to the active device(s), the terms "in the substrate", "in the semiconductor substrate" and equivalents are intended to include all such variations.

FIG. 1a illustrates a semiconductor device 20 including a semiconductor substrate 21 having a front surface 22 and a rear surface 23. The semiconductor device 20 also includes an LDMOS transistor 24 in the front surface 22 and a metallization structure 25 arranged on the front surface 22. The metallization structure 25 includes at least one cavity 27 arranged in at least one dielectric layer 28.

In the embodiment illustrated in FIG. 1a, the semiconductor substrate 21 has a bulk resistivity of greater or equal to 100 Ohm·cm, i.e. $\rho \geq 100$ Ohm·cm and may include a single crystal substrate, such as a silicon single crystal substrate. In this embodiment, the substrate 21 may be called a highly resistive substrate.

If the bulk resistivity of the semiconductor substrate is equal or greater than a predetermined level, parasitic inductor-substrate coupling and device parasitics can be substantially reduced. The desirable predetermined level is usefully equal or greater than 100 Ohm·cm resistivity, conveniently equal or greater than about 500 Ohm·cm resistivity, more conveniently equal or greater than about 1000 Ohm·cm resistivity. As used herein, the term "bulk resistivity" refers to those portions of substrate that lie outside the doped device regions of the LDMOS transistor 24.

Figure 1B:
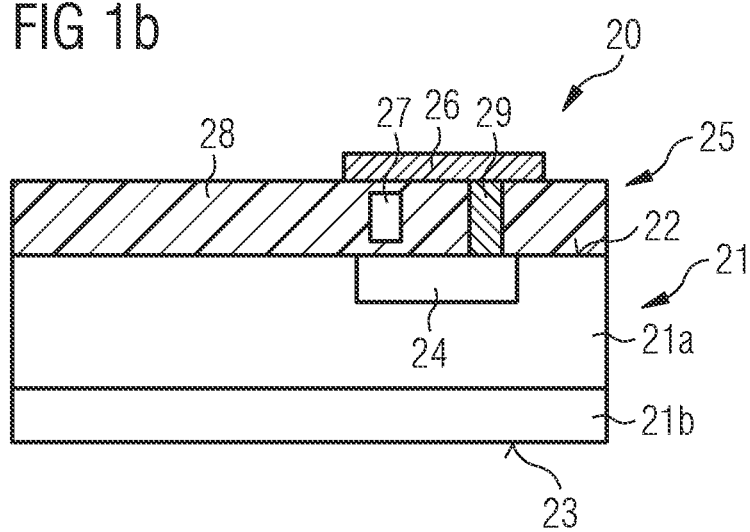
FIG. 1b illustrates a semiconductor device including a LDMOS transistor and a metallization structure.

In other embodiments, such as that illustrated in FIG. 1b, the semiconductor substrate 21 includes a layer 21a epitaxially deposited onto a highly doped substrate 21b. The highly doped substrate 21b may be a highly doped silicon wafer, for example p+, and the epitaxial layer 21a may comprise doped silicon, for example p.

The metallization structure 25 is arranged on the front surface 22 of the semiconductor substrate 21 and may include one or more conductive vias 29 which extend through the thickness of the dielectric layer 28 to couple a conductive layer such as a runner or a contact pad 26 arranged on the dielectric layer 28 to an electrode of the LDMOS transistor 24.

The cavity 27 may be filled with a material, such as air or a low-k dielectric material or a vacuum, which has a lower dielectric constant than a dielectric constant of the dielectric material or materials defining the cavity, for example the dielectric constant of the material of the dielectric layer 28. The cavity 27 may be used to provide a volume of localised decreased dielectric constant within the metallization structure 25.

The at least one cavity 27 may be arranged in regions of the metallization structure 25 having an electric field that is greater than an average electric field within the metallization structure 25. The at least one cavity 27 may be arranged in regions of the metallization structure 25 in order to ensure that a value for the electric field in that region within the metallization structure 25 remains below a threshold value. For example, the at least one cavity 27 may be arranged between a drain and a gate of the LDMOS transistor in order to reduce capacitive coupling.

As the cavity 27 has a lower dielectric constant than the dielectric material defining it, the cavity may also be used positioned in the metallization structure 25 to reduce capacitive coupling between portions of the conductive redistribution structure coupled to differing electrodes of the LDMOS transistor 24, for example between the conductive redistribution structure coupled to the source and the conductive redistribution structure coupled to the drain.

FIGS. 2a, 2b and 2c illustrate embodiments of the internal structure of the dielectric layer 28. The dielectric layer 28 may include two or sublayers which may be arranged to define the cavity 27 in various ways.

In the embodiment illustrated in FIG. 2a, the dielectric layer 28 may include a first sublayer 30 which defines the base and side walls of the cavity 27' and a second sublayer 31 which is arranged on the first sublayer 31 and caps and seals the cavity 27'.

In the embodiment illustrated in FIG. 2b, the dielectric layer 28 may include three sublayers, a first sublayer 32, which forms the base of the cavity 27", a second sublayer 33, which is arranged on the first sublayer 32 and forms the side walls of the cavity 27" and a third sublayer 34 which is arranged on the second sublayer 33 and caps and seals the cavity 27".

In the embodiment illustrated in FIG. 2c, the dielectric layer 28 includes four sublayers. A first sublayer 35 forms the base of the cavity 27''', a second and a third sublayer 36, 37 form the sidewalls of the cavity 27''' and a fourth sub-layer 36 forms the top or cap of the cavity 27'''.

The sublayers 30 to 38 of the dielectric layer may include the same dielectric material or differing dielectric materials. For example, alternate layers may include an oxide, such as $SiO_x$ or $SiO_2$ and the intervening layer includes a nitride such as $SiN_x$.

In some embodiments, the cavity 27 is defined on all sides by one or more dielectric materials. In some embodiments, one or both of the top and base of the cavity 27 may be provided by a semiconductor layer or a metallic layer.

Figure 3A:
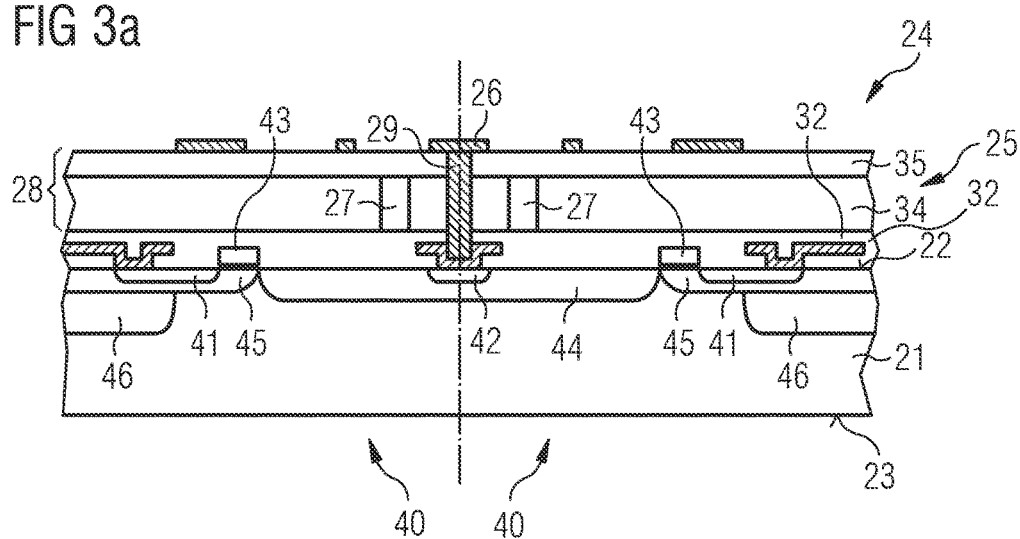
FIG. 3a illustrates a cross-sectional view of a semiconductor device including a LDMOS transistor and a metallization structure.
Figure 3B:
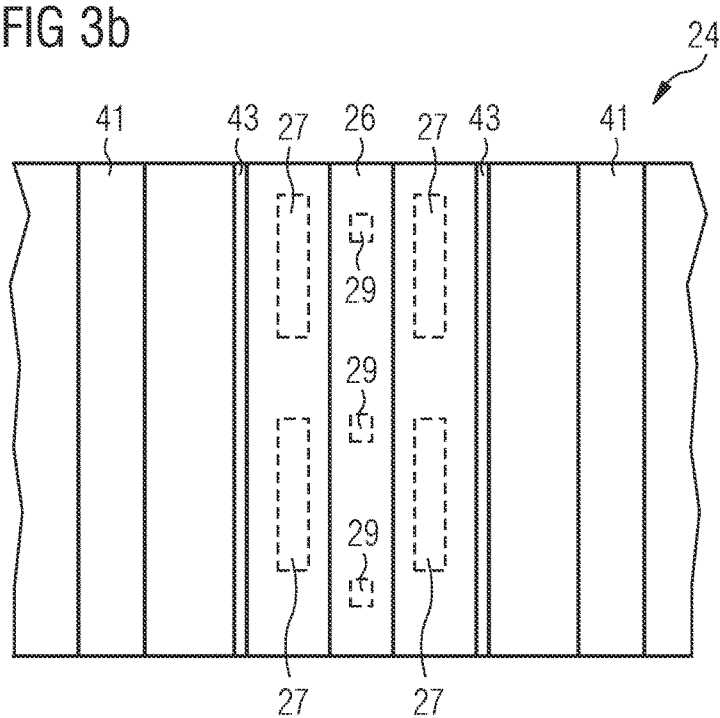

The structure of the LDMOS transistor 24 is illustrated in more detail in FIG. 3, whereby FIG. 3a illustrates a cross-sectional view and FIG. 3b illustrates a top view of a portion of the LDMOS transistor 24. The semiconductor substrate 21 may be a highly resistive substrate as illustrated in FIG. 1a or include an epitaxial layer 21a arranged on a highly doped substrate 21b as illustrated in FIG. 1b.

The LDMOS transistor 24 may include a plurality of transistor cells 40 each including a doped source region 41, a doped drain region 42 and a gate 43 arranged in the front surface 22 of the semiconductor substrate 21. The gate 43 may be laterally arranged between the source region 41 and drain region 42. The gate 43 may be asymmetrically arranged between source region 41 and drain region 42 such that the distance between the source region 41 and the gate 43 is less than the distance between the gate 43 and the drain region 42.

The LDMOS transistor 24 includes a plurality of transistor cells 40 in which the arrangement of source region 41 and gate 43 of neighbouring transistor cells 40 has a symmetrical arrangement around a common drain region 42 such that the pattern of source gate drain gate source gate drain gate source is formed. The source region 41, the gate 43 and the drain region 42 have an elongate striped form as can be seen in the plan view of FIG. 3b.

The metallization structure 25 may include separate conductive redistribution paths to electrically couple the source regions 41 of the transistors cells 40 to a common source contact pad, the drain regions 42 of the transistor cells 40 to a common drain pad and the gates 43 of the transistor cells 40 to a common gate pad.

The LDMOS transistor 24 includes a source region 41 which is highly doped with a second conductivity type, for example n+, and a drain region 42 which is highly doped with the second conductivity type, for example n+. The source region 41 and the drain region 42 are arranged at the front surface 22 of the semiconductor substrate 21 asymmetrically around the gate 43 arranged on the front surface 22.

A drift region 44 extends into the front surface 22 under the gate 43 in the direction of the drain region 42 and may be doped with the second conductivity type, for example n. The drift region 44 extends further into the semiconductor substrate 11 than the drain region 42. The drift region 44 is doped with the second conductivity type, for example n, and has a dopant concentration which is less than the dopant concentration of the drain region 42 and of the source region 41.

The LDMOS transistor 24 further includes a channel region 45 doped with the first conductivity type which extends from the drift region 44 under the source region 41 and a body contact region 46 which is doped with the first conductivity type and extends from the front surface 22 into the semiconductor substrate 21 deeper than the channel region 45. The drift region 44 extends into the semiconductor substrate 11 by a greater distance than a channel region 45. The body contact region 46 is provided by a highly doped well of the second conductivity type, for example p+.

In some embodiments, the semiconductor substrate 21 may include silicon which is lightly doped with a first conductivity type, for example p−. In embodiments in which the semiconductor substrate 21 includes a highly doped substrate 21b and epitaxial layer 21a, the highly doped substrate 21b may be p+ and the epitaxial layer p-doped.

When the gate 43 is appropriately biased, a conductive channel forms between the source region 41 and the drain region 42. The exemplary conductivity types presented above are suitable for forming an N-channel structure, but a P-channel structure can also be formed by appropriate interchange of conductivity type of the various doped regions and appropriate modification of the bias on gate 43.

The source region 41 of the LDMOS transistor 24 may be coupled to the rear surface 23 of the semiconductor substrate 21. The conductive path between the source region 41 and the rear surface 23 may have different forms.

In some embodiments, a conductive via is provided which extends from the front surface 22 to the rear surface 23 through the semiconductor substrate 21. The conductive via may be positioned such that the body contact 46 surrounds the upper portion of the conductive via. The conductive via may be lined with a metal, such as tungsten or copper. In some embodiments, the base of the conductive via is filled with high purity copper and the upper portion of the via includes high purity copper clad sidewalls which surround a gap. The top of the via may be sealed to provide a cavity or void within the upper portion of the through substrate via. A conductive path may also be provided from the front surface 22 to the rear surface 23 by a highly doped sinker structure.

One or more cavities 27 may be positioned adjacent each side of the common drain 42 of two adjacent transistor cells 40. A plurality of cavities 27 may be arranged in a row adjacent each side of the drain 42 as can be seen in the plan view of FIG. 3b. Each cavity 27 may have an elongate structure as the source region 41, gate 43 and drain region 42 of the LDMOS transistor cells typically have the form of elongate stripes. However, the lateral shape of the cavities 27 is not limited to a rectangular lateral shape and may have an oval shape or an elongate shape with rounded ends. The lateral shape of the cavity 27 is also not limited to an elongate shape and may be circular, square, or hexagonal, for example. The length of the cavities 27 and the distance between neighbouring cavities may be selected such that the dielectric layer 28 has suitable mechanical properties.

A semiconductor device including a substrate, a LDMOS transistor and a metallization structure may include a multilevel metallization structure including two or more dielectric layers and intervening conductive layers. In embodiments, in which the metallization structure has a multilevel structure, at least one cavity may be arranged in one, two, some or all of the dielectric layers.

FIG. 4 illustrates a semiconductor device 50 according to an embodiment which includes a substrate 51 with a front surface 52 and rear surface 53, a LDMOS transistor 54 arranged in the front surface 52 and a multilevel metallization structure 55 arranged on the front surface. The substrate 51 may include a semiconductor, such as a silicon wafer, and have a bulk resistivity of greater or equal to 100 Ohm·cm, or include an epitaxial layer on a highly doped substrate.

A first metallization level 56 may include a first dielectric layer 57 arranged on the front surface 52 of the substrate 51 and a first metal layer 58 arranged on the first dielectric layer 57. A second metallization level 59 may include a second dielectric layer 60 arranged on the first metal layer 58 and a second metal layer 61 arranged on the second dielectric layer 60. The metallization structure 55 may also include a third dielectric layer 62 arranged on the second metal layer 61 and a third metal layer 63 arranged on the third dielectric layer 62. The third metal layer 63 may provide one or more contact pads 64 of the semiconductor device 50.

As an example, a drain 65 of two neighbouring transistor cells 66, 66' of the LDMOS transistor 54 may be electrically coupled to the contact pad 64 by a first conductive via 67 which extends through the first dielectric layer 57, a portion of the first metal layer 58, which provides a drain runner 68 and is arranged on the first conductive via 67, a second conductive via 69 which extends through the second dielectric layer 60 and is positioned on the drain runner 68 and extends into a portion providing a further drain runner 80 in the second metal layer 61 and a third conductive via 70 which extends through the third dielectric layer 62 is arranged on the further drain runner 80. The conductive pad 64 may be arranged on the third conductive via 70. The first, second and third conductive vias 67, 69, 70 and the drain runner 68 of the first metal layer 68 and further drain runner 80 of the second metal layer 61 may be arranged in a stack.

The first conductive layer 58 and the second metal layer 61 include conductive portions 68, 80 arranged in a dielectric material 79. The conductive portions 68, 80 may have lateral extent which is greater than the lateral extent of the underlying conductive via 67, 69.

The metallization structure 55 may include a first cavity 71 arranged in the first dielectric layer 57 adjacent a first side 72 of the first conductive via 67 and a second cavity arranged 73 in the second dielectric layer 60 adjacent a first side 74 of the second conductive via 69. The second cavity 73 may extend through the second dielectric layer 60 and the dielectric material 79 of the second metal layer 61.

In embodiments in which the transistor cells 66, 66' of the LDMOS transistor 54 are arranged symmetrically about the drain 65, the metallization structure 55 may include a third cavity 75 arranged in first dielectric layer 57 adjacent a second side 76 of first conductive via 67, the second side 76 opposing the first side 72, and a fourth cavity 77 extending through the second dielectric layer 60 and second metal layer 61 and adjacent a second side 78 of the second conductive via 69, the second side 78 opposing the first side 73.

The lateral extent of the conductive portions providing the drain runners 68, 80 may determine the minimum distance between the first cavity 71 and the third cavity 75 and the first conductive via 67 and between the second cavity 73 and fourth cavity 77 and the second conductive via 69. In the embodiment illustrated in FIG. 4, the dielectric material 79 of first conductive layer 58 may be used to cap and seal the first cavity 71. The dielectric material 79 of the third dielectric layer 62 may be used to cap and seal the second cavity 73 and the dielectric material 79 of the first metal layer 58 may be used to provide the base of the second cavity 73.

The conductive vias 67, 69, 70 and the conductive layers 58, 61 may include one or more metals. In one embodiment, the first conductive via 67 includes tungsten and the first and second conductive layers 58, 61 and second and third conductive vias 69, 70 may include high purity copper.

In some embodiments, the sidewalls and base of the conductive vias 67, 69, 70 may include one or more further layers which may provide adhesion promotion function between the tungsten or copper of the conductive via and the sidewalls of the via formed by the dielectric material. For example, a Ti, TiN Cu seed layer, Cu stack may be arranged on the sidewalls of the conductive vias 69, 70. The contact pad 64 may include copper and may include an outermost conductive layer which is easily solderable. In some embodiments, the contact pad 64 includes an outermost gold layer or aluminium layer.

The dielectric layers 57, 60, 62 and the dielectric material 79 of the conductive layers 58, 60 may include differing materials. In some embodiments, the dielectric layers 57, 60, 62 include SiO or $SiO_2$ and the dielectric material 79 of the conductive layers 58, 60 includes a nitride such as $SiN_x$.

The cavities 71, 75, 73, 77 may be positioned within the metallization level 56, 59 in regions of high electric field strength to effectively reduce capacitive coupling of the different electrode structures involved.

For a metallization structure 55 including high purity copper vias and copper conductive layers, damascene techniques may be used. In some embodiments, the copper portions of the first conductive layer 58 may be formed by a single damascene technique and the second conductive via 69 and further drain runner 80 may be formed using a dual damascene technique such that the second conductive via 69 and the further drain runner 80 are formed in a single deposition process and are integral.

FIG. 5a illustrates a schematic flow diagram 90 of a method for manufacturing a semiconductor device. In block 91, at least one dielectric layer is applied to a front surface of a semiconductor substrate including a LDMOS transistor structure. In block 92, an opening is formed in at least one dielectric layer. In block 93, the opening is covered with a further dielectric layer to seal the cavity.

The cavity maybe filled with a material which has a lower dielectric constant than that of the dielectric layer defining the walls of the cavity. For example, the cavity may include air or a vacuum. Therefore, the cavity may be used to provide a localised reduction in the dielectric constant of the dielectric layer and to reduce parasitic coupling by suitable placement within the metallization structure.

FIG. 5b illustrates a flow diagram 100 of a method for forming the opening. In this embodiment, in block 101, a first opening is formed in at least one dielectric layer and filled with a sacrificial material. In block 102, a second dielectric layer is formed on the first dielectric layer. In block 103, at least one second opening is formed in the second dielectric layer to expose the region of the conductive material within the first opening. In block 104, the sacrificial material is removed from the first opening through the second opening. In block 105, a further layer is applied to the second dielectric layer to close and seal the second opening and thus seal the cavity. The further layer may be a dielectric material, thus forming a cavity defined on all sides by dielectric material.

The sacrificial material may be a conductive material and may be the same conductive material as that inserted into the conductive vias coupled to one or more doped regions of the LDMOS transistor.

In one embodiment, the method may be carried out at the same time as the formation of the conductive vias to one or more doped regions of the LDMOS transistor. In this embodiment, the conductive material arranged in the conductive vias coupled to an electrode of the LDMOS transistor remains covered and protected by the second dielectric layer whilst the sacrificial material is removed through the second openings from the first openings filled with conductive material that is not coupled to an electrode of the LDMOS transistor. The sacrificial material-filled first openings may be termed dummy structures or dummy conductive vias as they do not form part of the conductive redistribution structure of the metallization structure.

By fabricating the cavities by first filling the openings in the first dielectric layer with the conductive material inserted into the conductive vias, the number of additional steps required may be minimised, since the additional steps in comparison with the fabrication of the conductive via are limited to the formation of openings in the third dielectric layer and the etching process to remove the conductive material.

The position of the cavities may be selected so as to reduce capacitive coupling between one or more of the conductive paths provided by the metallization structure for the electrodes of the LDMOS transistor, for example to reduce capacitive coupling between the gate and drain electrodes, between the gate and source electrodes, and/or between the source and drain electrodes in embodiments in which the metallization structure is multilevel metallization structure, one or more cavities may be positioned in one or more layers of the multilayer metallization structure.

The openings may be formed in the first dielectric layer and in the second dielectric layer by applying a structured mask. The openings in the second dielectric layer may be laterally smaller than the lateral area of the first opening. In some embodiments, two or more discrete openings are formed above a single conductive via which acts as a precursor for a cavity or as a dummy structure. The number, size and arrangement of the openings in the second dielectric layer may be selected so as to allow complete etching of the conductive material within the second conductive via so that the cavity is bounded by dielectric material only and such that the opening can be reliably covered by the application of further dielectric layer so as to form an enclosed and sealed cavity. The cavity may extend onto one or more further dielectric layers such that the sidewalls of the cavity are formed by two or more stacked dielectric layers.

The conductive vias coupled to the LDMOS transistor and the conductive vias acting as dummy structures may further include one or more additional layers arranged on the sidewalls and optionally the base of the opening. The one or more additional layers may include Ti, and/or TiN for a tungsten filled via or Ta and/or TaN for a Cu filled via and serve as adhesion promoters and/or diffusion barriers.

The conductive material including any additional liner layers may be removed from the second conductive via by etching techniques, including reactive ion etching and wet etching or a combination of etching techniques.

FIG. 6 illustrates a cross-sectional view of a semiconductor device 110 including a substrate 111 and a LDMOS transistor 112 formed in a front, surface 113 of the substrate 111. The substrate 111 may include a silicon single crystal and has a bulk resistivity of at least 100 Ohm·cm.

The LDMOS transistor 112 includes a highly doped source region 114, a highly doped drain region 115 and a gate 116 arranged laterally between the highly doped source region 114 and highly doped drain region 115. The LDMOS transistor 112 also includes a doped drift region 117 which extends from the front surface 113 into the substrate 111 from the gate 116 to the highly doped drain region 115, a doped channel region 118 which extends from the front surface 113 into the substrate 111 and from gate to the highly doped source region 114 and a doped body contact region 119. The doped body contact region 119 extends further into the substrate 111 from the front surface 113 than the doped channel region 118.

The highly doped source region 114, the highly doped drain region 115 and the drift zone 117 have a first conductivity type, for example n-type, which opposes the conductivity type of the substrate 111. The channel region 118 and the body contact region 111 have a second conductivity, for example p-type, which opposes the first conductivity type.

The LDMOS transistor 114 also includes a field plate 120 which extends from the gate 116 in the direction of the highly doped drain region 115 and a gate shield 121 which extends from the gate 116 in the direction of the highly doped source region 114. The LDMOS transistor 114 also includes a doped buried layer 147 coupled to the body contact region 111 which extends throughout the lateral area of the substrate. The doped buried layer 147 is spaced apart and at a distance from the front surface 113 and rear surface of the substrate 111 and along with the field plate 120 and drift region 117 forms part of a RESURF structure for the LDMOS transistor 114.

The semiconductor device 110 includes a multilevel metallization structure arranged on the front surface 113 which provides a conducting path from the highly doped source region 114, highly doped drain region 115 and gate 116 to a respective contact pad at the outer surface of the semiconductor device 110.

The first level of metallization 122 includes a stack of four dielectric layer including a $SiO_2$ layer 123 arranged on the front surface 113 a BPSG layer 124 arranged on the $SiO_2$ layer 123, a silicon nitride layer 125 arranged on the BPSG layer 124, a $SiO_x$ layer 126 arranged on silicon nitride layer 125 and a further silicon nitride layer 127 arranged on the $SiO_x$ layer 126.

Vias are formed through this multilayer dielectric stack to provide a conductive via 128 arranged on and coupled to the highly doped drain region 115, a conductive via 129 which is coupled to the gate and a conductive via 130 which is coupled to the highly doped source region 114. The electrical contact between the conductive via 129 and the gate 116 takes place outside of the plane illustrated in FIG. 6.

Two further conductive vias 131, 132 are positioned adjacent opposing side faces 133 134 of the conductive via 128 which is coupled to the highly doped drain region 115. The conductive vias 128, 129, 130, 131, 132 may include one or more liners such as a Ti layer and TiN layer positioned on the sidewalls and the base. The conductive vias 128, 129, 130, 131, 132 are filled with a conductive material which, in this embodiment, is tungsten. The upper surface 135 may be planarised such that the upper surface of the conductive material of the vias 128, 129, 130, 131, 132 and the $SiO_x$ layer 126 is substantially coplanar.

The conductive vias 128, 129, 130, 131, 132 are in each case one of a row of vias which extends into the plane of the drawing.

The conductive vias 131, 132 are now subjected to additional processes to form cavities within the dielectric material of the first metallization level 122. The conductive vias 131, 132 may be considered as dummy structures since they do not form part of the conductive redistribution structure of the metallization structure.

As is illustrated in FIG. 7, a silicon nitride layer 136 is applied to the SiOx layer 126 and covers the conductive vias 128, 129, 130. A resist mask 139 is applied to the nitride layer 136 and structured so as to form openings 137, 138 above the conductive vias 131, 132. The openings 137, 138 are laterally smaller than the lateral area of the conductive vias 131, 132 at the surface 135.

As is illustrated in FIG. 8, the conductive material including the liner layers is removed from the conductive vias 131, 132, for example by using etching techniques, to produce two openings 140, 140' through the dielectric stack adjacent to, and spaced apart from, the conductive via 128 coupled to the highly-doped drain region 115.

As is illustrated in FIG. 9, a dielectric layer 141, for example including SiO$_2$, is applied to the silicon nitride layer 136 which covers the openings 137, 138 in the silicon nitride layer 136 and forms cavities 144, 145 within the dielectric material of the first metallization level 122.

The SiO$_2$ layer 141 and the silicon nitride layer 136 is patterned to form openings to the conductive vias 128, 130 which are coupled to the highly doped drain region 115 and highly doped source region 114, respectively.

High purity copper is deposited and fills the openings and is therefore electrically coupled to the conductive material within the vias 128, 130. A planarisation process is carried out to produce discrete copper portions arranged within the thermal oxide layer 141. Such a process may be denoted as a single Damascene process.

Before deposition of the high purity copper, a tantalum nitride, tantalum, copper seed layer stack may be deposited within the openings and the copper material which fills the openings may be deposited using an electroplating technique. The surface may then be planarised, for example using chemical mechanical polishing (CMP).

Figure 10:
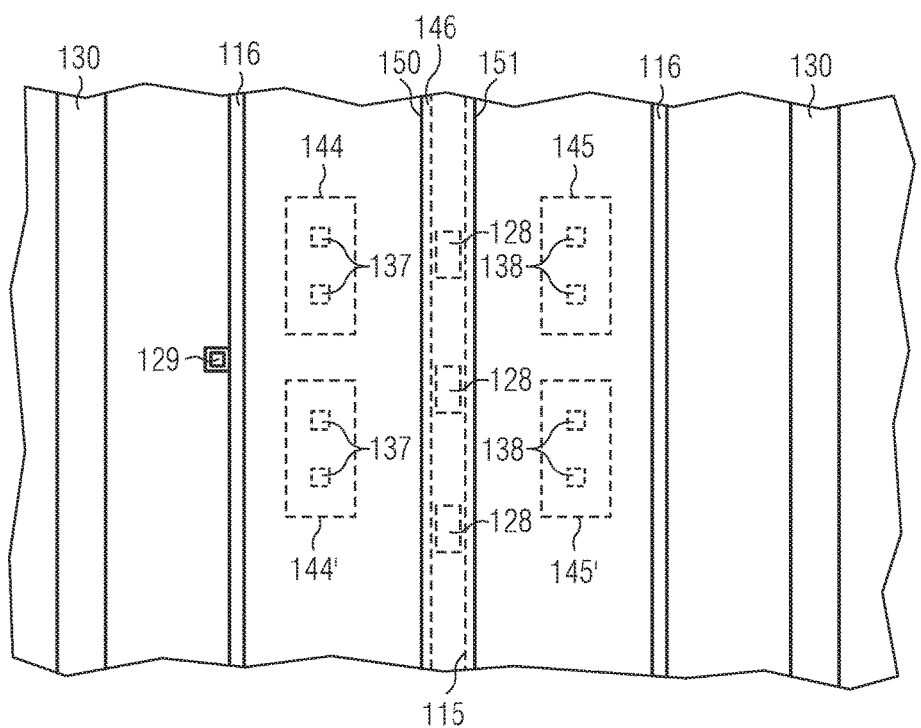
FIG. 10 illustrates a plan view of the first level of the multilevel metallization structure of FIG. 9.

FIG. 10 illustrates a plan view of the arrangement of the cavities 144, 145 and the conductive connection to the highly doped drain region 115.

As can be seen in the plan view, the highly doped drain region 115 and the drain runner 146 have an elongate, strip-like form. The drain runner 146 is laterally slightly wider than the highly doped drain region 115.

A plurality of conductive vias 128 is provided, each of which has a lateral area which is less than the lateral area of the drain runner 146. The conductive vias 128 are arranged at intervals along the length of the highly doped drain region 115 and drain runner 146. The drain runner 146 is arranged on and electrically coupled with the plurality of contact vias 128.

A plurality of cavities 144, 144' is arranged in a row adjacent and substantially parallel to the first side 150 of the drain runner 146 and the conductive vias 128 and a plurality of cavities 145, 145' is arranged adjacent the opposing side 151 of the drain runner 146. As can also be seen in the plan view, the openings 143 to the cavities 144, 144' and 145, 145' are laterally smaller than the lateral area of the cavity 144, 144' and 145, 145'. The minimum distance between the cavities 144, 145 and the respective side of the conductive via 128 is determined by the lateral width of the drain runner 146 as the lateral width of the drain runner 146 is greater than the lateral width of the conductive vias 128.

Figure 11:
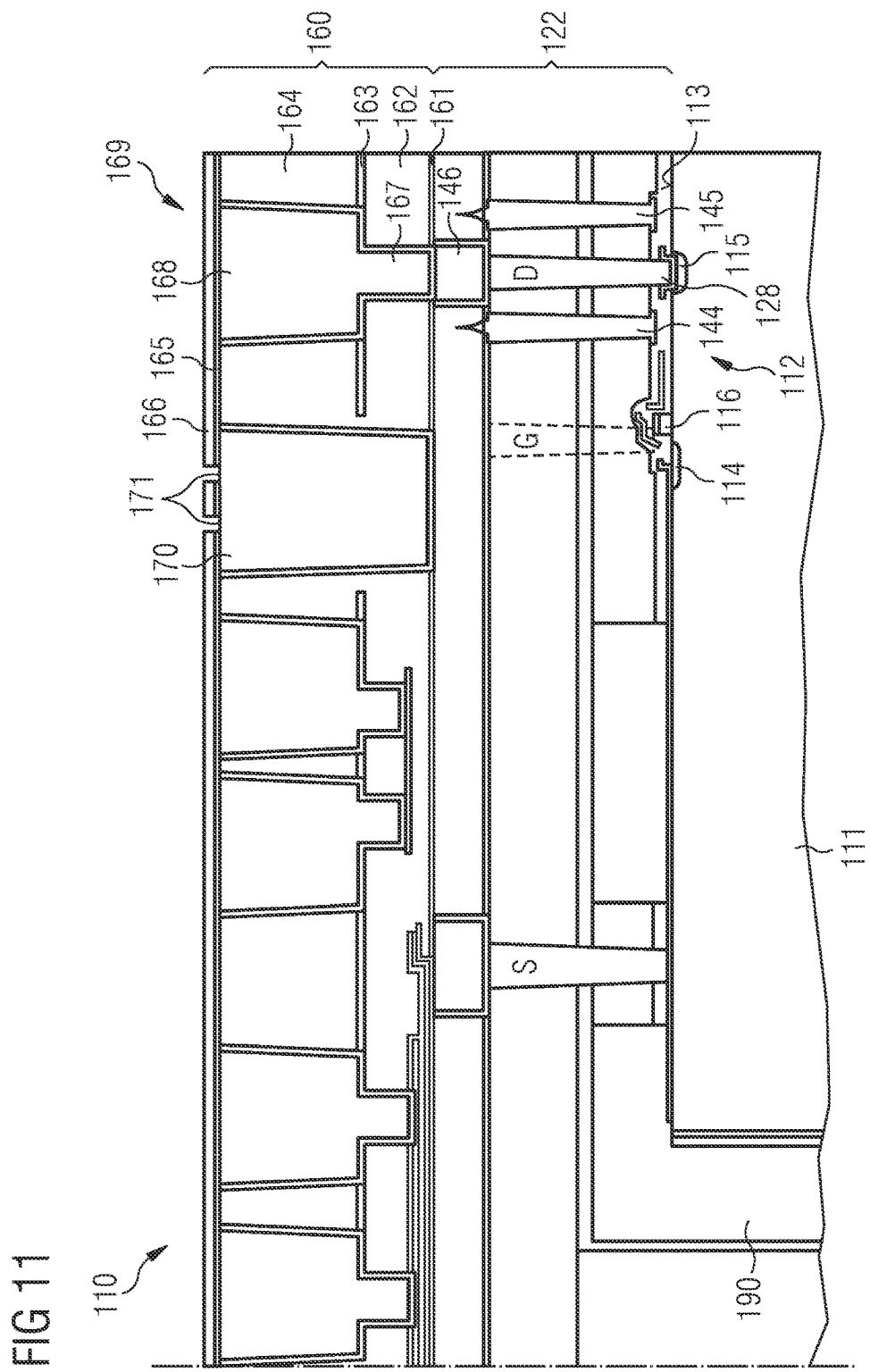
FIG. 11 illustrates a semiconductor device including a LDMOS transistor and a second level of a multilevel metallization structure.

FIG. 11 illustrates the semiconductor device 110 after deposition of a second metallization level 160 arranged on the first metallization level 122. The second metallization level 160 may include a stack of dielectric layers including a silicon nitride layer 161 arranged on the SiO$_2$ layer 141, a SiO$_2$ layer 162 arranged on the silicon nitride layer 161, silicon nitride layer 163 arranged on the SiO$_2$ layer 162, a SiO$_2$ layer 164 arranged on the silicon nitride layer 163, a silicon nitride layer 165 arranged on the SiO$_2$ layer 164 and a SiO$_2$ layer 166 arranged on the silicon nitride layer 165.

The second metallization level 160 includes metal via portions 167 which extend through the silicon nitride layer 161 and SiO$_2$ layer 162. The second metallization level 160 further includes a conductive redistribution structure which extends through the silicon nitride layer 163 and SiO$_2$ layer 164. In the case of the metallization structure 169 for the drain contact, a plurality of conductive vias 167 may be provided which are arranged spaced at intervals along the length of the underlying drain runner 146. The redistribution portion 168 may have elongate substantially strip-like form. The conductive via 167 and conductive portion 168 may be fabricated by forming openings in the stack of dielectric layers and filling the openings using a dual Damascene technique to form both the conductive vias in the layers 161, 162 and the conductive portion 166 in the dielectric layers 163, 164 using a single deposition process.

Figure 12:
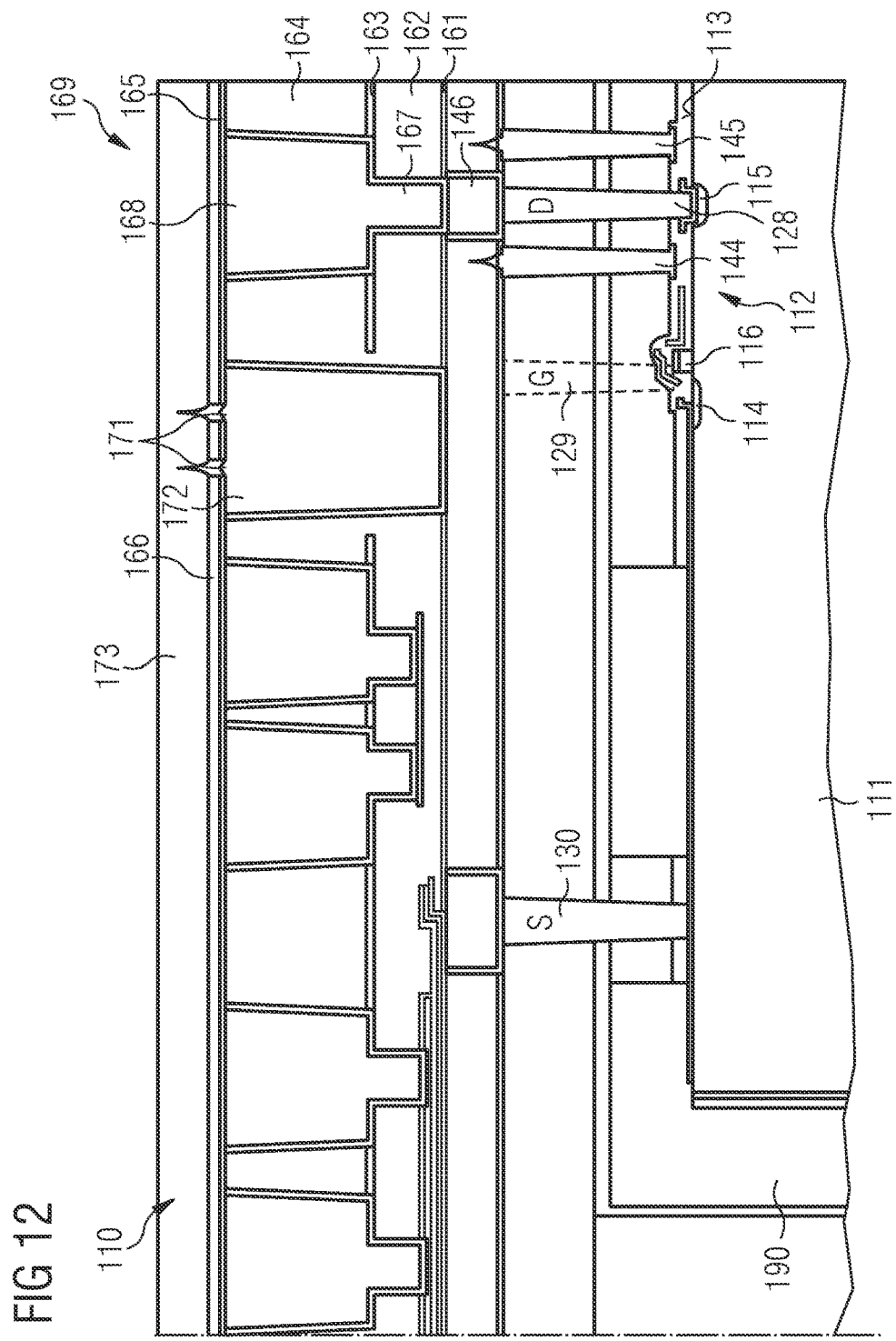
FIG. 12 illustrates a semiconductor device including a LDMOS transistor and a cavity within a second level of a multilevel metallization structure.

In embodiments in which cavities are formed in the second metallization level 160, such as that illustrated in FIG. 12, the cavities may be formed by forming sacrificial metal portions or dummy structures 170 within the stack of dielectric layers 161, 162, 163, 164 along with the conductive vias 167 and redistribution layer 166. The dummy structures 170 may have an elongate shape and be arranged in a row extending substantially parallel to side face of the conductive structure of the drain contact stack 169.

In some embodiments, the drain sided edge of one row of the dummy structures 170 may be positioned above the gate.

In order to remove the copper from the dummy structures 170, openings may be formed in the silicon nitride layer 165 and SiO$_2$ layer 166 covering the top of the conductive layer 168. One or more openings 171 to each of the dummy structures 170 may be formed in the silicon nitride layer 165. The conductive material, in particular high purity copper of the dummy structure 170, may be removed through these openings 171 using etching processes to form a cavity 172 which is defined by dielectric material.

As is illustrated in FIG. 12, the openings 171 in the silicon nitride layer 165 may be covered by subsequently depositing a further oxide layer 173 to form a sealed cavity 172. One or more further cavities may also be formed on the opposing side of the drain contact structure 169.

Figure 13:
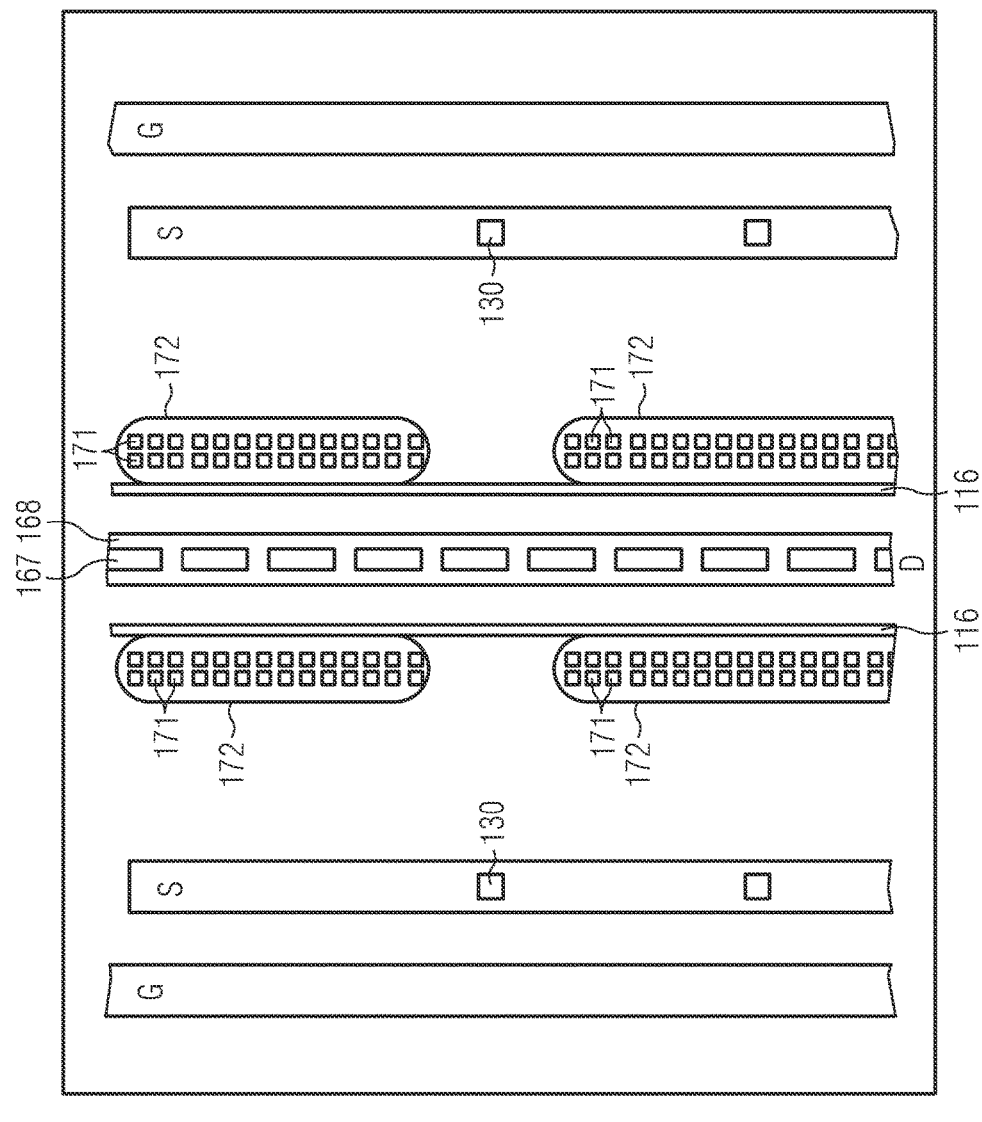
FIG. 13 illustrates a plan view of the second level of the multilevel metallization structure of FIG. 12.

FIG. 13 illustrates a plan view of the second metallization level 160 and illustrates the strip-like drain runner 168 arranged on and electrically coupled with a plurality of conductive vias 167. The cavities 172 and the plurality of openings 171 are arranged in a row adjacent to opposing long sides of the drain runner 168 and partially overlap with the gate fingers of the underlying metallic layer. A source runner is arranged adjacent each row of cavities and gate runner adjacent the opposing side of the source one.

FIG. 14 illustrates a further metallization level 180 to provide a conductive structure between the drain metal stack 169 and an outer contact pad 181. The further metallization level 180 may include one or more dielectric layers 182, 183, a metal contact 184 extending through the dielectric layers 165 and 166 and one or more through contacts 185. The contact pad 181 may also be defined on the upper surface by depositing a further nitride layer 186 which may overlap some or all peripheral regions of the metal contact pad 181.

In some embodiments, such as that illustrated in FIG. 14, cavities 144, 145, 172 are arranged within differing levels 122, 160 of the multilevel metallization structure 155. However, cavities may be arranged in only one of the metallization layers or more than one of the metallization layers. The position of the cavities may be selected such that a localised region of the dielectric material of the metallization structure 155 is provided with a lower dielectric constant at positions within the metallization structure suitable for reducing the maximum electric field at that position and for reducing capacitive coupling between two or more separate conductive portions of the redistribution. structures provided by the metallization structure, for example, between the source distribution structure and the drain redistribution structure.

The highly doped source region 114 of the LDMOS transistor 112 may be electrically coupled to a rear surface of the substrate 11 by one or more conductive through substrate vias 190 arranged adjacent the LDMOS transistor 112 and, in some embodiments, between highly doped source regions 114 of neighbouring LDMOS transistor cells or segments. The right-hand side of a portion of one of a row of conductive through substrate vias 190, which extends into the plane of the drawing, is illustrated in FIGS. 6 to 14.

FIG. 15 illustrates an alternative view of the semiconductor device 110 and the conductive through substrate via 190. The conductive through substrate via 190 may be fabricated after the fabrication of the LDMOS transistor 112 and before the metallization structure 120 is applied to the front surface.

The conductive through substrate via 190 includes a via 191 formed the semiconductor substrate 111 which extends from the front surface 113 to the rear surface 192 and has side walls 193 defined by the material of the semiconductor substrate 111.

A multilayer lining 194 is deposited on the side walls 193 of the blind via 100. The multilayer lining 194 may include adhesion and/or barrier layers, for example. Conductive material 195 including high purity copper is deposited on the multilayer lining 101 in the via 191 and further extends over the front surface 113 of the substrate 111 and is coupled to the doped source region 114 of the LDMOS transistor 112.

The conductive material 195 may be deposited using a two stage process and includes two subparts. A first subpart 196 is arranged in the base of the via 191 which completely fills the base of the via 191 to provide a type of conductive plug arrangement at the rear surface 192 of the substrate 111 The second subpart 197 has the form of a layer which covers the side walls 193 of the via 191 and the upper surface 198 of the conductive plug 196 such that the second subpart 197 surrounds a gap 199 in the upper portion of the via 191. The second subpart 197 may have a U-shaped form the as-deposited state and an open-ended ring shaped form in an annealed state.

The first subpart 196 and the second subpart 197 may be deposited by electroplating. The conditions used to electroplate the first subpart 196 and the second subpart 197 may be selected in order that vertical growth is favoured and lateral growth is suppressed during deposition of the first subpart 196 in order to fill the volume of the via 191 at the base and so that lateral growth is favoured during growth of the second subpart 196 so as to produce a lining which sounds the gap 199. The first subpart 196 and the second subpart 197 may have different microstructures. For example, the first subpart 196 may have an average grain size that is larger than an average grain size of the second subpart 197.

In subsequent processing steps the substrate 111 may be subjected to raised temperatures, for example during a subsequent annealing process. The raised temperatures may cause grain growth within the first subpart 196 and second subpart 197 such that the interface between the base of the second subpart 196 and first subpart 197 is no longer discernible. The region of the second subpart 197 arranged on the side walls 193 of the via 191 may be discernible from the first subpart 196 which fills the via 191 by a difference in microstructure, for example a smaller average grain size.

The conductive portions 200 of the second subpart 197 arranged on the front surface 113 may be substantially surrounded by dielectric material. Such arrangements and methods are known as dual damascene processes, since a vertical conductive layer is formed in the via 191 and a lateral conductive layer is formed on the front surface 113 of the substrate 111 using a single deposition process and conductive portions embedded in a dielectric matrix are formed.

A cavity 201 is arranged in the upper portion of the conductive through substrate via 191. The cavity 201 may be defined by dielectric material. In some embodiments, a first dielectric material 202 lines the gap 199 formed in the via 191 by the second subpart 197 and the first subpart 196 of the conductive material 195. A second dielectric material 203 caps the gap 199 and together with the first dielectric material 202 defines a sealed and enclosed cavity 201.

The conductive through substrate via 190 is partially filled and includes a dielectric defined cavity 201 in its upper portion. The conductive through substrate via 190 includes a bottom closed metal plane provided by the conductive plug 196 and a top plane which is formed by the dielectric layer 203 sealing the cavity 199. The closed metal plane at the bottom prevents contamination of the via during working of the rear surface 192 of the substrate 111 and the cavity 201 provides an expansion volume.

The conductive through substrate via 190 may be fabricated by inserting the conductive material 195 into a blind via and working the rear surface of the initial substrate to remove material and expose the base 204 of the first subpart 196 in the rear surface 192 of the final substrate 111 in order to electrically couple the source 114 of the LDMOS transistor 112 to the rear surface 191 of the substrate 11. The final thickness of the substrate 111, $t_f$, may be around 60 μm.

One or further conductive layers 205 are arranged on the rear surface 191 of the semiconductor substrate 111 and base 204 of the conductive via 191. The conductive layer 205 is coupled to the source 114 by means of the conductive material of the first subpart 196 and second subpart 197. The conductive layer 205 on the rear surface 191 of the substrate 111 may be used to mount the device and electrically couple the source 114 to a die pad or flange.

The semiconductor device including one or more LDMOS transistors according to any one of the embodiments described herein may be used in a high frequency power amplifying circuit, such as RF power amplifying circuits for use in cellular communications operating at frequencies in the range of 700 MHz to 3.6 GHz, power conversion in cellular communication networks and Doherty configuration amplifying circuits.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising a substantially planar front surface,
a LDMOS (Lateral Diffused Metal Oxide Semiconductor) transistor in the front surface; and
a metallization structure arranged on the front surface,
wherein the metallization structure comprises at least one cavity arranged in at least one dielectric layer, wherein the at least one cavity is positioned above, and spaced apart from, the front surface,
wherein the metallization structure further comprises a first dielectric layer arranged on the front surface, a first conductive layer arranged on the first dielectric layer and at least one first conductive via, wherein the at least one cavity is arranged adjacent a side face of the at least one first conductive via,
wherein the at least one cavity extends through the first dielectric layer and is bounded on a lower surface by a second dielectric layer and on an upper surface by a third dielectric layer, wherein the third dielectric layer comprises a plurality of openings in communication with the at least one cavity, the plurality of openings being covered by a fourth dielectric layer,
wherein the first dielectric layer comprises three sublayers, the first sublayer comprising BPSG, the second sublayer comprising SiN and the third sublayer comprising SiOx, and wherein the second dielectric layer comprises SiON, the third dielectric layer comprises SiN and the fourth dielectric layer comprises $SiO_x$.

2. The semiconductor device of claim 1, wherein the at least one cavity is defined by dielectric material on all sides.

3. The semiconductor device of claim 1, wherein the at least one cavity is arranged in regions of the metallization structure having an electric field that is greater than an average electric field of the semiconductor device.

4. The semiconductor device of claim 1, wherein the at least one cavity is arranged between a drain region and a gate of the LDMOS transistor so as to reduce capacitive coupling.

5. The semiconductor device of claim 1, wherein the at least one first conductive via electrically couples a drain of the LDMOS transistor to the first conductive layer.

6. The semiconductor device of claim 1, wherein a first cavity is arranged adjacent a first side of the at least one first conductive via and a second cavity is arranged adjacent a second side of the at least one first conductive via, the second side opposing the first side.

7. The semiconductor device of claim 1, wherein the at least one cavity is arranged between drain-sided edge of a field plate and a drain region of the LDMOS transistor.

8. The semiconductor device of claim 1, wherein a first plurality of cavities is arranged in a first row adjacent a first side face of a conductive via extending though the at least one dielectric layer.

9. The semiconductor device of claim 8, wherein a second plurality of cavities is arranged in a second row adjacent a second side face of the conductive via extending though the first dielectric layer, the second side face opposing the first side face.

10. The semiconductor device of claim 1, wherein the semiconductor substrate has a bulk resistivity $\rho \geq 100$ Ohm·cm.

11. The semiconductor device of claim 10, further comprising a conductive via extending from the front surface to a rear surface of the semiconductor substrate, the conductive via being coupled to a source of the LDMOS transistor.

12. A semiconductor device, comprising:
a semiconductor substrate comprising a substantially planar front surface,
a LDMOS (Lateral Diffused Metal Oxide Semiconductor) transistor in the front surface; and
a metallization structure arranged on the front surface,
wherein the metallization structure comprises at least one cavity arranged in at least one dielectric layer, wherein the at least one cavity is positioned above, and spaced apart from, the front surface,
wherein the metallization structure further comprises a first dielectric layer arranged on the front surface, a first conductive layer arranged on the first dielectric layer and at least one first conductive via, wherein the at least one cavity is arranged adjacent a side face of the at least one first conductive via,
wherein the at least one cavity extends through the first dielectric layer and is bounded on a lower surface by a second dielectric layer and on an upper surface by a third dielectric layer, wherein the third dielectric layer comprises a plurality of openings in communication with the at least one cavity, the plurality of openings being covered by a fourth dielectric layer,
wherein the semiconductor device further comprises at least one third cavity in a fifth dielectric layer arranged on the fourth dielectric layer.

13. The semiconductor device of claim 12, further comprising a second conductive via extending through the fifth dielectric layer, wherein the at least one third cavity is arranged adjacent a side face of the second conductive via.

14. The semiconductor device of claim 13, wherein the second conductive via is integral with a runner arranged on the fifth dielectric layer.

* * * * *